US012183658B2

(12) United States Patent
Ushijima

(10) Patent No.: US 12,183,658 B2
(45) Date of Patent: Dec. 31, 2024

(54) SEMICONDUCTOR MODULE

(71) Applicant: Mitsubishi Electric Corporation, Tokyo (JP)

(72) Inventor: Koichi Ushijima, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 372 days.

(21) Appl. No.: 17/595,551

(22) PCT Filed: Jul. 26, 2019

(86) PCT No.: PCT/JP2019/029392
§ 371 (c)(1),
(2) Date: Nov. 18, 2021

(87) PCT Pub. No.: WO2021/019594
PCT Pub. Date: Feb. 4, 2021

(65) Prior Publication Data
US 2022/0216130 A1  Jul. 7, 2022

(51) Int. Cl.
*H01L 23/473* (2006.01)
(52) U.S. Cl.
CPC .................. *H01L 23/473* (2013.01)
(58) Field of Classification Search
CPC ... H01L 23/473; H01L 23/4006; H01L 24/00; H01L 25/18; H01L 2023/405; H01L 23/3677
See application file for complete search history.

(56) References Cited

U.S. PATENT DOCUMENTS

2013/0058041 A1  3/2013  Gohara et al.
2013/0135824 A1  5/2013  Harubeppu et al.
(Continued)

FOREIGN PATENT DOCUMENTS

CN  103137576 A  6/2013
CN  103460362 A  12/2013
(Continued)

OTHER PUBLICATIONS

An Office Action; "Notice of Reasons for Refusal," mailed by the Japanese Patent Office on Jan. 17, 2023, which corresponds to Japanese Patent Application No. 2021-536444 and is related to U.S. Appl. No. 17/595,551; with English language translation.
(Continued)

*Primary Examiner* — Jonathan Han
(74) *Attorney, Agent, or Firm* — Studebaker & Brackett PC

(57) ABSTRACT

A semiconductor module includes a refrigerant jacket including a refrigerant passage through which a refrigerant circulates and an opening extending from an outer surface to the refrigerant passage, a base mounted on the refrigerant jacket and closing the opening, and a semiconductor element provided at the base. The base includes an annular peripheral wall positioned inside the opening, a bottom plate connected to an end portion of the peripheral wall on a side closer to the refrigerant passage, and a fin protrusion protruding from the bottom plate toward the inside of the refrigerant passage and formed on the bottom plate. The base has a recess formed with the peripheral wall and the bottom plate and extending toward the opening. The semiconductor element is disposed on the bottom plate inside the recess.

10 Claims, 7 Drawing Sheets

(56) References Cited

U.S. PATENT DOCUMENTS

2015/0021750 A1* 1/2015 Fujino .................... H01L 23/24
                                                        257/667
2017/0332522 A1* 11/2017 Ushijima .............. H01L 23/473
2018/0286781 A1   10/2018 Yoshihara et al.

FOREIGN PATENT DOCUMENTS

| JP | 2014-512678 A | 5/2014 |
| JP | 2014-146723 A | 8/2014 |
| WO | 2011/132736 A1 | 10/2011 |
| WO | 2013/141287 A1 | 9/2013 |
| WO | 2017/094370 A1 | 6/2017 |

OTHER PUBLICATIONS

International Search Report issued in PCT/JP2019/029392; mailed Oct. 8, 2019.
An Office Action mailed by China National Intellectual Property Administration on Apr. 30, 2024, which corresponds to Chinese Patent Application No. 201980098692.9 and is related to U.S. Appl. No. 17/595,551; with English language translation.

* cited by examiner

SEMICONDUCTOR MODULE

TECHNICAL FIELD

The present disclosure relates to a semiconductor module.

BACKGROUND ART

Semiconductor modules including semiconductor elements such as insulated gate bipolar transistors (IGBTs) and a cooler for cooling the semiconductor devices are conventionally known.

For example, a semiconductor module disclosed in WO2017/094370 includes a power module including a semiconductor device and a radiator, and a cooling device having a cooling passage through which coolant water flows.

The semiconductor device is sealed by a package that is a sealing member, and the radiator is disposed on the lower surface of the package. The radiator includes a mounting portion on which the package is mounted, a stepped portion formed on the lower surface side of the mounting portion, and a plurality of cooling fins formed at the stepped portion.

The cooling device has an opening that reaches the cooling passage, and the radiator of the semiconductor device is attached to the opening. Specifically, the stepped portion of the radiator is fitted in the opening of the cooling device, and the cooling fins are disposed in the cooling passage.

CITATION LIST

Patent Literature

PTL 1: WO2017/094370

SUMMARY OF INVENTION

Technical Problem

In the semiconductor module described in WO2017/094370, the mounting portion on which the package is mounted has a stepped portion protruding downward, and the cooling fins are formed on the lower surface of the stepped portion. Since the stepped portion is formed between the mounting surface on which the package is mounted and the cooling fins, the distance between the mounting surface and the cooling fins is long. As a result, the heat transfer path for dissipating heat of the semiconductor device in the package from the cooling fins to the cooling water is long, which makes it difficult to dissipate the heat of the semiconductor.

The present disclosure is made in view of the problem described above and an object of the present disclosure is to provide a semiconductor module including a semiconductor element and a cooling jacket, in which heat from the semiconductor element can be dissipated well.

Solution to Problem

A semiconductor module according to the present disclosure includes: a refrigerant jacket including a refrigerant passage through which a refrigerant circulates and an opening extending from an outer surface to the refrigerant passage; a base mounted on the refrigerant jacket and closing the opening; and a semiconductor element provided at the base. The base includes a peripheral wall in an annular shape positioned inside the opening, a bottom plate connected to an end portion of the peripheral wall on a side closer to the refrigerant passage, and a fin protrusion protruding from the bottom plate toward inside of the refrigerant passage and formed on the bottom plate. The base has a recess formed with the peripheral wall and the bottom plate and extending toward the opening. The semiconductor element is disposed at the bottom plate inside the recess.

In the semiconductor module described above, the semiconductor element is provided at the bottom plate positioned at the bottom portion of the recess, and the semiconductor element is provided at a position closer to the refrigerant passage than the upper end of the fixing portion. With this configuration, heat of the semiconductor element is dissipated well to the refrigerant.

Advantageous Effects of Invention

According to the present disclosure, in a semiconductor module including a semiconductor element and a cooling jacket, heat from the semiconductor element can be dissipated well.

DESCRIPTION OF EMBODIMENTS

Referring to FIG. 1 to FIG. 7, a semiconductor module according to embodiments of the present invention will be described. In the configurations shown in FIG. 1 to FIG. 7, the same or substantially same configuration is denoted by the same reference sign and an overlapping description is not repeated.

First Embodiment

Figure 1:
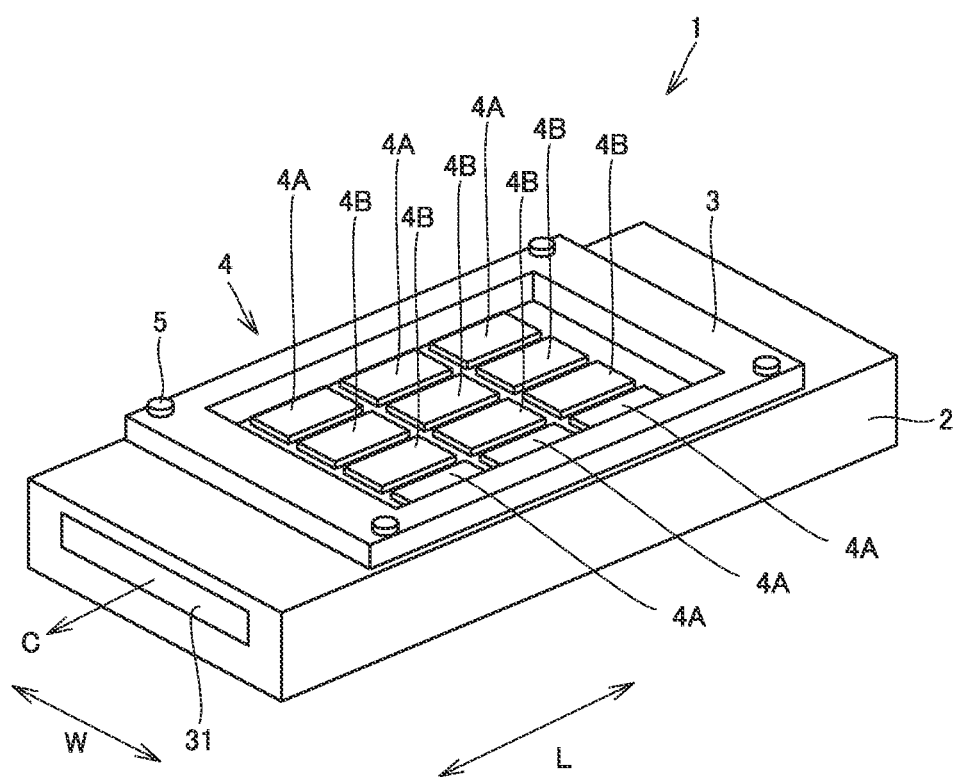
FIG. 1 is a perspective view of a semiconductor module 1 according to a first embodiment.

FIG. 1 is a perspective view of a semiconductor module 1 according to a first embodiment. Semiconductor module 1 includes a refrigerant jacket 2 in the inside of which a refrigerant C flows, a base 3 mounted on refrigerant jacket 2, and a plurality of semiconductor elements 4 provided at base 3.

Figure 2:
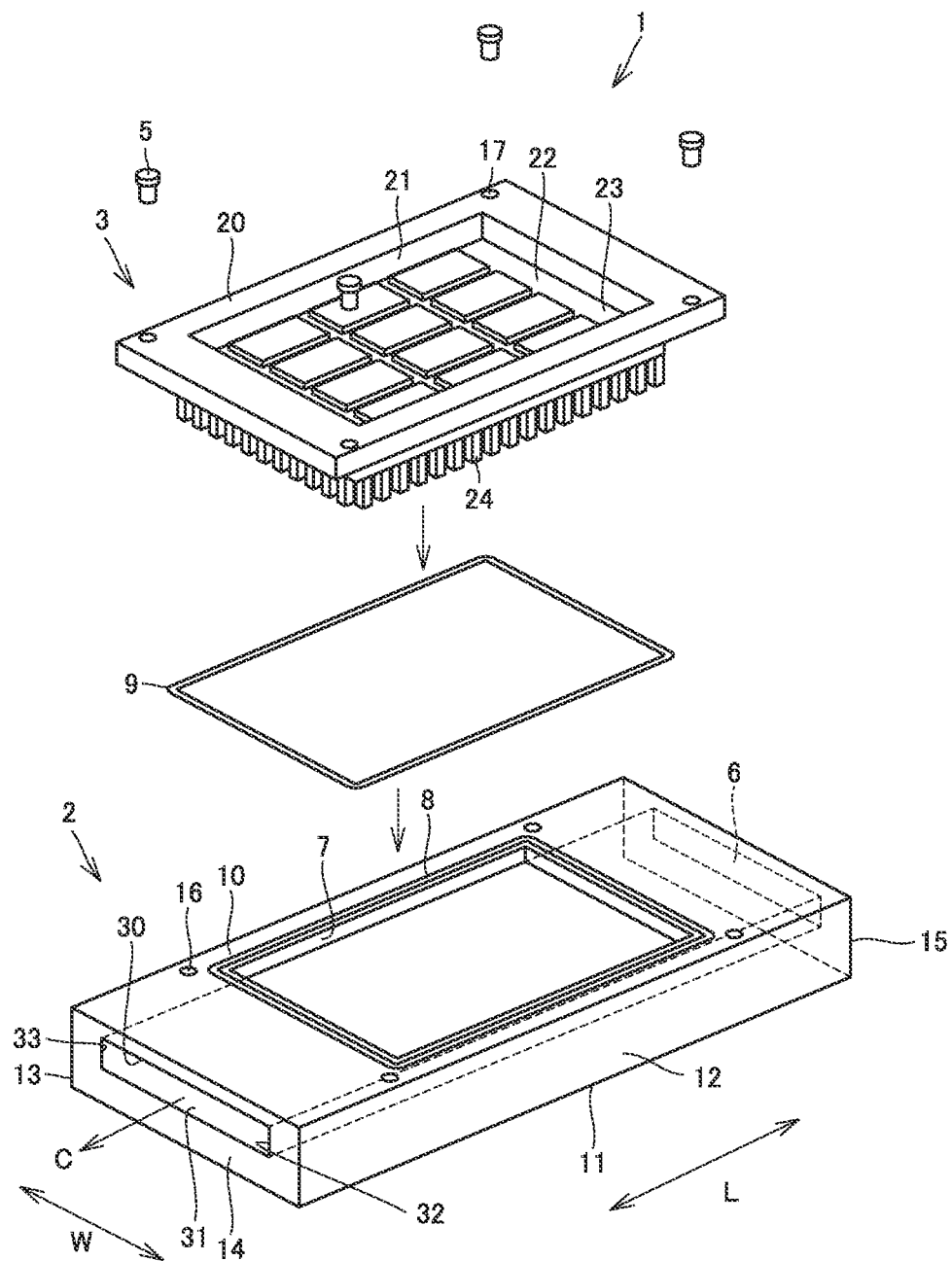
FIG. 2 is an exploded perspective view of semiconductor module 1.

FIG. 2 is an exploded perspective view of semiconductor module 1. Refrigerant jacket 2 has a refrigerant passage 6 through which refrigerant C flows, and an opening 7 extending from an outer surface of refrigerant jacket 2 to refrigerant passage 6.

In the example shown in FIG. 2, refrigerant jacket 2 is formed in the shape of a rectangular parallelepiped. Refrigerant jacket 2 has an upper surface 10, a lower surface 11, a side surface 12 positioned at one end in the width direction W of refrigerant jacket 2, a side surface 13 positioned at the other end in the width direction W, an end surface 14 positioned at one end in the longitudinal direction L of refrigerant jacket 2, and an end surface 15 positioned at the other end in the longitudinal direction L.

Refrigerant passage 6 is formed to extend from end surface 14 to end surface 15. An inner surface of refrigerant passage 6 includes a top surface 30 positioned on the side closer to upper surface 10, a bottom surface 31 positioned on the side closer to lower surface 11, an inner side surface 32 positioned on the side closer to side surface 12, and an inner side surface 33 positioned on the side closer to side surface 13. Opening 7 is formed in upper surface 10, and upper surface 10 has a ring groove 8 and a plurality of screw holes 16.

Ring groove 8 is formed annularly along the opening edge of opening 7, and an O ring 9 is attached to ring groove 8. A plurality of screw holes 16 are spaced apart from each other along ring groove 8.

Base 3 has a recess 23. Base 3 has a flange 20 extending annularly, a bottom plate 22, a peripheral wall 21 connecting flange 20 and bottom plate 22, and a plurality of fin protrusions 24 formed on bottom plate 22.

A plurality of semiconductor elements 4 are disposed in recess 23, and a plurality of semiconductor elements 4 are disposed at bottom plate 22. In the present first embodiment, semiconductor module 1 is an inverter for vehicles and an inverter for a three-phase motor. As shown in FIG. 1, a plurality of semiconductor elements 4 are six IGBTs 4A and six free-wheeling diodes (FwDis) 4B. In the width direction W, FwDis 4B are disposed closer to the center of refrigerant passage 6 than IGBTs 4A.

Figure 3:
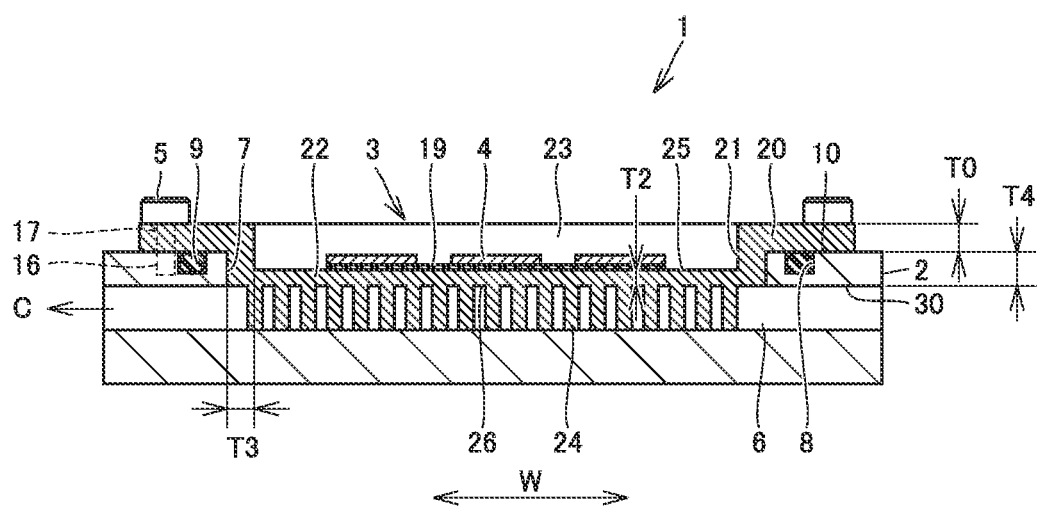
FIG. 3 is a cross-sectional view of semiconductor module 1.

FIG. 3 is a cross-sectional view of semiconductor module 1. Referring to FIG. 2 and FIG. 3, flange 20 is disposed on upper surface 10 of refrigerant jacket 2 and formed annularly along the opening edge of opening 7.

Peripheral wall 21 is formed to extend from the opening edge of flange 20 toward refrigerant passage 6. Peripheral wall 21 is disposed in contact with an inner peripheral surface of opening 7, and peripheral wall 21 is formed annularly.

Bottom plate 22 is connected to an end portion of peripheral wall 21 on the side closer to refrigerant passage 6. Bottom plate 22 is formed to close the opening of peripheral wall 21 positioned on the side closer to refrigerant passage 6. Here, the thickness T2 of bottom plate 22 is smaller than the thickness T0 of flange 20 and the thickness T3 of peripheral wall 21. The thickness T2 of bottom plate 22 is smaller than the thickness T4 between upper surface 10 and top surface 30 of refrigerant jacket 2.

Recess 23 is formed with peripheral wall 21 and bottom plate 22. Recess 23 is formed to extend from the outer surface of flange 20 toward opening 7.

Bottom plate 22 has a placement surface 25 forming a part of the inner surface of recess 23 and a cooling surface 26 disposed on the side closer to refrigerant passage 6.

Semiconductor elements 4 are disposed at placement surface 25 with a substrate 19 interposed. Substrate 19 is provided on the upper surface of placement surface 25. Substrate 19 includes an insulating plate and circuit wiring formed on the upper surface of the insulating plate. The circuit wiring electrically connects semiconductor elements 4.

A plurality of fin protrusions 24 are formed on cooling surface 26. Specifically, a plurality of fin protrusions 24 are spaced apart from each other and arranged in an array.

Here, bottom plate 22 is disposed such that cooling surface 26 of bottom plate 22 is flush with the inner surface of refrigerant passage 6. In the present embodiment, cooling surface 26 is flush with top surface 30 of refrigerant passage 6. As used herein "flush" not only means that there is no step between cooling surface 26 and top surface 30 but also means that there is substantially no step between cooling surface 26 and top surface 30. "There is substantially no step" means that, for example, there is only a step as small as a few mm between cooling surface 26 and top surface 30.

O ring 9 is disposed in ring groove 8 and is in intimate contact with flange 20. O ring 9 suppresses leakage of refrigerant C from between upper surface 10 of refrigerant jacket 2 and flange 20.

Flange 20 has screw holes 17. In a state in which peripheral wall 21 of base 3 is attached to opening 7, screw hole 17 is communicatively connected to screw hole 16 formed in upper surface 10. A screw groove is formed in the inner peripheral surface of screw hole 16, 17.

Screw 5 is inserted in screw hole 16 and screw hole 17 to fix base 3 to refrigerant jacket 2.

In semiconductor module 1 configured as described above, when semiconductor elements 4 such as IGBTs 4A and FwDis 4B perform switching, semiconductor elements 4 produce heat. On the other hand, semiconductor elements 4 are disposed at bottom plate 22 that is a bottom portion of recess 23 formed in base 3. In other words, semiconductor elements 4 are provided at a position closer to refrigerant passage 6 than the upper end of peripheral wall 21. In a different point of view, semiconductor elements 4 are provided at a position closer to refrigerant passage 6 than upper surface 10 of refrigerant jacket 2.

Heat from semiconductor elements 4 are dissipated well to refrigerant C from cooling surface 26 of bottom plate 22 and a plurality of fin protrusions 24 formed on bottom plate 22. Specifically, since the thickness T2 of bottom plate 22 is smaller than thickness T0 of flange 20 and thickness T1 of peripheral wall 21, the heat transfer path for heat from semiconductor elements 4 to reach refrigerant C is relatively short. Therefore, heat from semiconductor elements 4 is dissipated well to refrigerant C. Furthermore, since the thickness T2 of bottom plate 22 is smaller than the thickness T4 between upper surface 10 and top surface 30 of refrigerant jacket 2, heat from semiconductor elements 4 can be dissipated to refrigerant C better than, for example, when the thickness T2 of bottom plate 22 is equivalent to the thickness T4.

Since the inner surface of refrigerant passage 6 is flush with cooling surface 26 of bottom plate 22, increase of circulation resistance when refrigerant C passes through a boundary between the inner surface of refrigerant passage 6 and cooling surface 26 is suppressed.

If a step is formed between the inner surface of refrigerant passage 6 and cooling surface 26, it is likely that refrigerant C collides against the step or refrigerant C swirls, and the circulation resistance of refrigerant C becomes high. As a result, the cooling performance of refrigerant C tends to deteriorate. On the other hand, in semiconductor module 1 according to the present first embodiment, increase of circulation resistance of refrigerant C is suppressed, and deterioration of cooling performance of refrigerant C is suppressed.

Since refrigerant passage 6 extends linearly, the flow rate of refrigerant C passing through refrigerant passage 6 increases toward the center in the width direction W in refrigerant passage 6. Referring to FIG. 1, FwDis 4B are positioned closer to the center of refrigerant passage 6 than IGBTs 4A in the width direction W. The higher the flow rate of refrigerant C is, the higher the cooling performance of refrigerant C is. FwDis 4B thus can be cooled actively. IGBTs 4A may be disposed closer to the center of refrigerant passage 6 than FwDis 4B in the width direction W. In this case, IGBTs 4A can be cooled actively.

Figure 4:
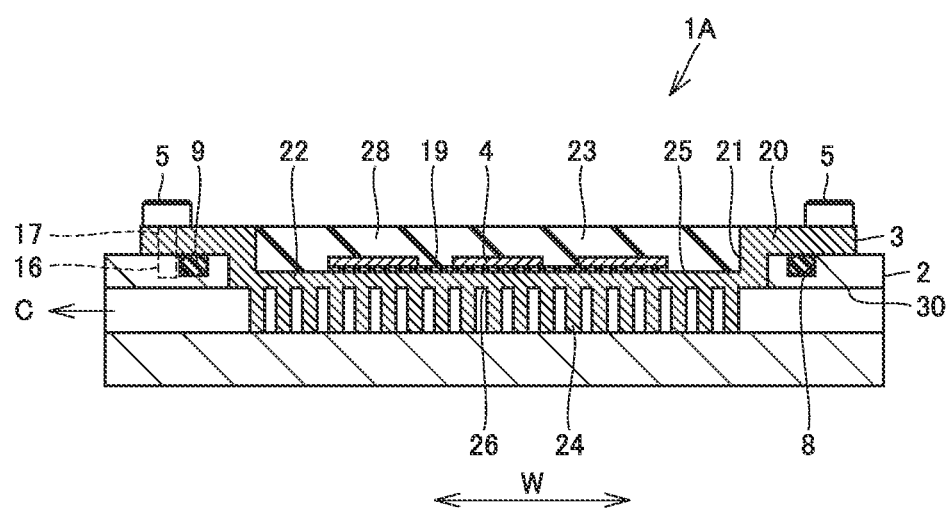
FIG. 4 is a cross-sectional view of a semiconductor module 1A according to a modification of semiconductor module 1.

FIG. 4 is a cross-sectional view of a semiconductor module 1A according to a modification of semiconductor module 1. In semiconductor module 1A, recess 23 is filled with filling resin 28, and semiconductor elements 4 and substrate 19 are covered with filling resin 28. This configuration can suppress adhesion of foreign substances such as water and dust to semiconductor elements 4 and substrate 19.

Second Embodiment

Figure 5:
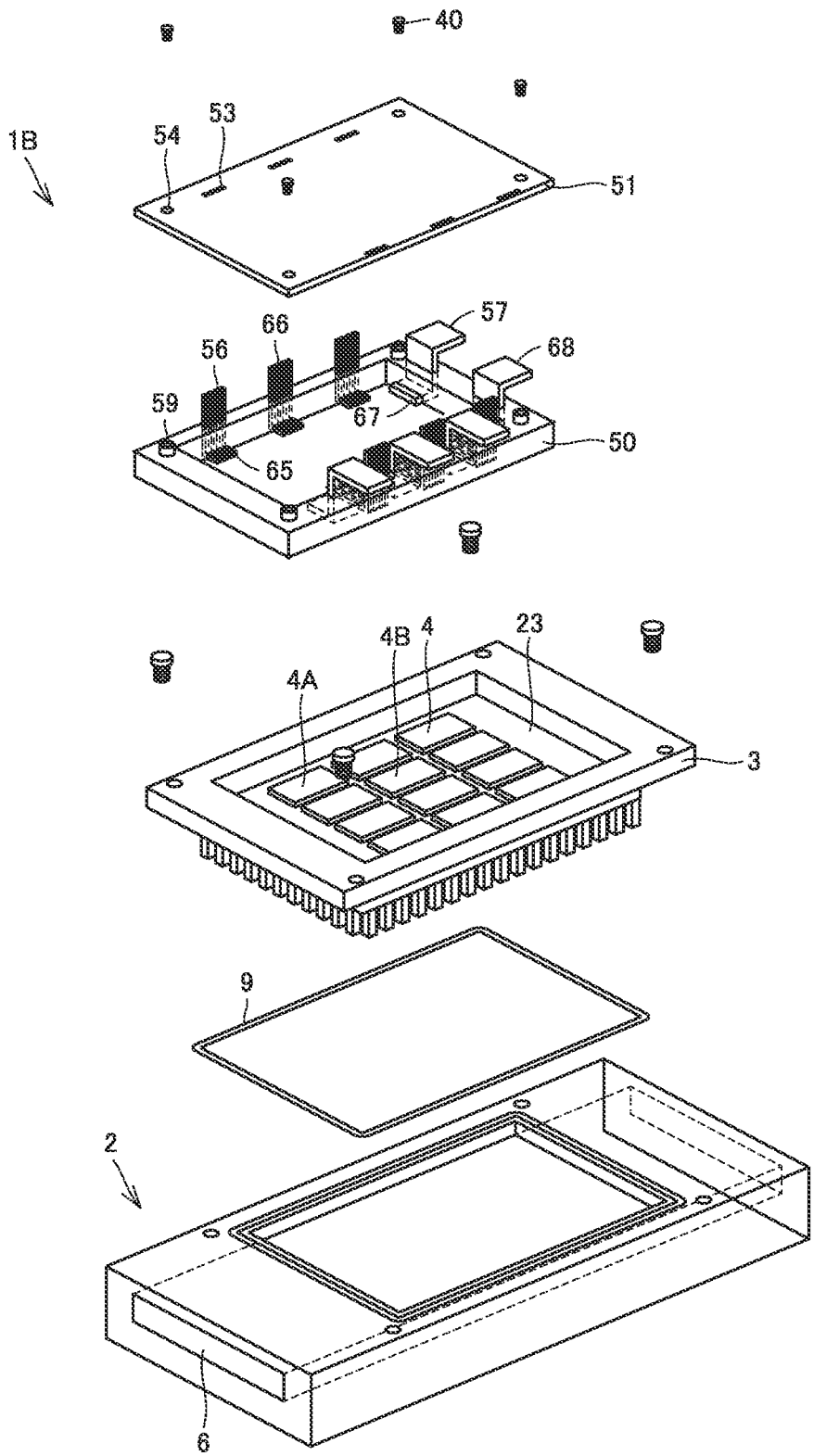
FIG. 5 is an exploded perspective view of a semiconductor module 1B according to a second embodiment.

FIG. 5 is an exploded perspective view of a semiconductor module 1B according to a second embodiment. Semiconductor module 1B further includes an electrode case 50 and a control substrate 51 in semiconductor module 1 according to the foregoing first embodiment.

Electrode case 50 is disposed in recess 23 of base 3, and control substrate 51 is disposed above electrode case 50.

Figure 6:
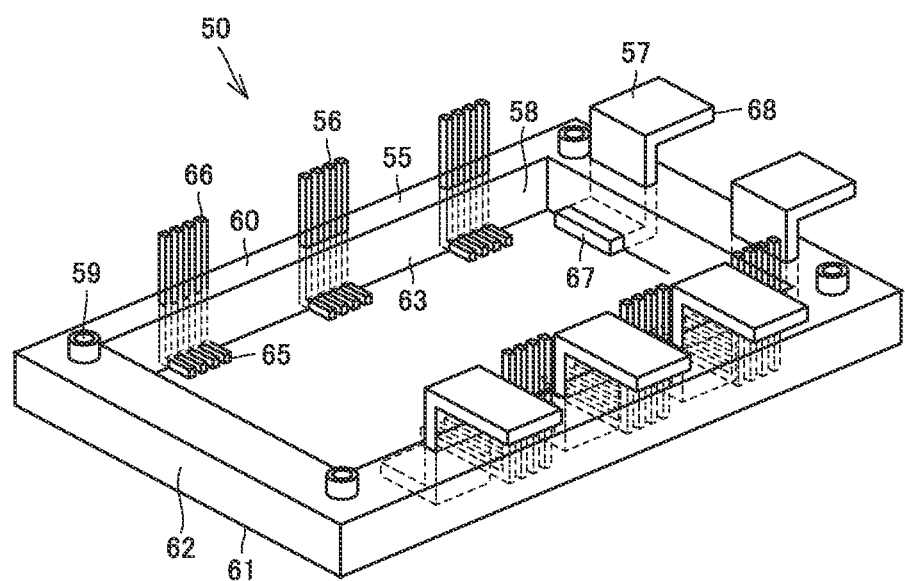
FIG. 6 is a perspective view of an electrode case 50.

FIG. 6 is a perspective view of electrode case 50. Electrode case 50 includes a body resin 55 formed in an annular shape, and a plurality of control terminals 56 and a plurality of electrode terminals 57 provided in body resin 55.

Body resin 55 is formed of an insulating material such as resin. Body resin 55 has an upper surface 60 and a lower surface 61. Body resin 55 has a hollow portion 58 extending from upper surface 60 to lower surface 61. Body resin 55 has an outer peripheral surface 62 and an inner peripheral surface 63 formed with hollow portion 58. A plurality of bosses 59 are formed on upper surface 60 of body resin 55.

Each control terminal 56 has an end portion 65 and an end portion 66. End portion 65 is positioned inside hollow portion 58. Control terminal 56 extends from end portion 65 toward inner peripheral surface 63 and is bent in body resin 55 so as to be flexed upward. Each control terminal 56 is formed to protrude outward and extend upward from upper surface 60.

Each electrode terminal 57 has an end portion 67 and an end portion 68. End portion 67 is positioned inside hollow portion 58. Electrode terminal 57 extends from end portion 67 toward inner peripheral surface 63 and is bent in body resin 55 to be flexed upward. Each electrode terminal 57 is formed to protrude outward from upper surface 60 and then extend horizontally.

In FIG. 5, end portion 65 of control terminal 56 and end portion 67 of electrode terminal 57 are electrically connected to IGBT 4A or FwDi 4B. Specifically, control terminal 56 and electrode terminal 57 are connected to the circuit wiring formed on the substrate and are electrically connected to IGBT 4A and FwDi 4B through the circuit wiring.

Control substrate 51 is shaped like a flat plate. A plurality of through holes 53 and a plurality of screw holes 54 are formed in control substrate 51. The end portion 66 side of control terminal 56 is inserted in each through hole 53. Control substrate 51 transmits a control signal for controlling switching of IGBT 4A and FwDi 4B through control terminal 56. End portion 68 of electrode terminal 57 is electrically connected to, for example, a three-phase motor or a boost converter.

Control substrate 51 is fixed to electrode case 50 by screws 40. Specifically, screw 40 is inserted in screw hole 54 and boss 59 and screwed in a threaded groove formed in the inner surface of boss 59.

Figure 7:
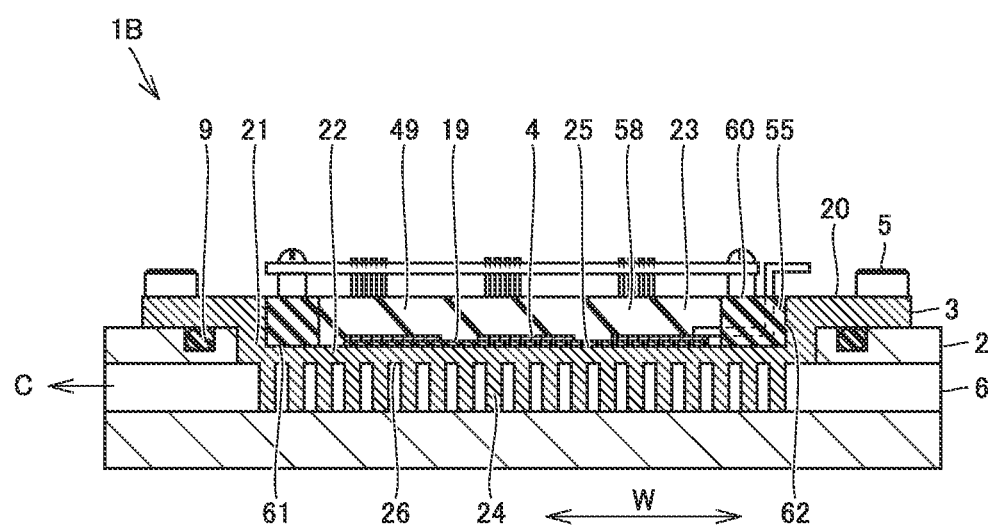
FIG. 7 is a cross-sectional view of semiconductor module 1B.

FIG. 7 is a cross-sectional view of semiconductor module 1B. Upper surface 60 of body resin 55 is flush with the upper surface of flange 20 of base 3. Lower surface 61 of body resin 55 is disposed to face placement surface 25 of bottom plate 22. Specifically, lower surface 61 is disposed to face a portion of placement surface 25 that is positioned between semiconductor element 4 and peripheral wall 21. Outer peripheral surface 62 extending annularly is in contact with the inner peripheral surface of peripheral wall 21, for example, at two or more places. In the example shown in FIG. 7, outer peripheral surface 62 is in contact with the inner peripheral surface of peripheral wall 21 over substantially the entire periphery.

Hollow portion 58 of body resin 55 is filled with filling resin 49. Semiconductor elements 4, substrate 19, parts of control terminals 56, and parts of electrode terminals 57 are covered with filling resin 49. Since semiconductor elements 4 and substrate 19 are covered with filling resin 49, adhesion of foreign substances such as water and dust to semiconductor elements 4 and substrate 19 is suppressed.

In semiconductor module 1B configured as described above, body resin 55 of electrode case 50 is positioned inside recess 23, and increase in height dimension of semiconductor module 1B is suppressed even when body resin 55 is attached to base 3.

A manufacturing process of manufacturing semiconductor module 1B includes an alignment process of aligning electrode case 50 with base 3 and a fixing process of fixing electrode case 50 to base 3 in the aligned state.

In the present second embodiment, since outer peripheral surface 62 of electrode case 50 is in contact with the inner peripheral surface of peripheral wall 21 at multiple places, electrode case 50 can be aligned with base 3 by inserting electrode case 50 into recess 23 in the alignment process. In this way, the alignment process is very simple in semiconductor module 1B.

In the fixing process, electrode case 50 can be fixed to base 3 by filling hollow portion 58 with filling resin 49 with electrode case 50 inserted in recess 23.

Semiconductor module 1B according to the second embodiment has a configuration similar to that of semiconductor module 1, and semiconductor module 1B also achieves operation and effect similar to that of semiconductor module 1.

Embodiments disclosed here should be understood as being illustrative rather than being limitative in all respects. The scope of the present disclosure is shown in the claims, and it is intended that all modifications that come within the meaning and range of equivalence to the claims are embraced here.

REFERENCE SIGNS LIST 1, 1A, 1B semiconductor module, 2 refrigerant jacket, 3 base, 4 semiconductor element, 6 refrigerant passage, 7 opening, 8 ring groove, 9 ring, 10, 60 upper surface, 11, 61 lower surface, 12, 13 side surface, 14, 15 end surface, 16, 17, 54 screw hole, 18, 40 screw, 19 substrate, 20 flange, 21 peripheral wall, 22 bottom plate, 23 recess, 24 fin protrusion, 25 placement surface, 26 cooling surface, 28, 49 filling resin, 30 top surface, 31 bottom surface, 32, 33 inner side surface, 50 electrode case, 51 control substrate, 53 through hole, 55 body resin, 56 control terminal, 57 electrode terminal, 58 hollow portion, 59 boss, 62 outer peripheral surface, 63 inner peripheral surface, 65, 66, 67, 68 end portion, C refrigerant, L longitudinal direction, T0, T1, T2 thickness, W width direction.

The invention claimed is:

1. A semiconductor module comprising:
   a refrigerant jacket including a refrigerant passage through which a refrigerant circulates and an opening extending from an outer surface to the refrigerant passage;
   a base mounted on the refrigerant jacket and closing the opening; and
   a semiconductor element provided at the base,
   the base including
      a peripheral wall in an annular shape positioned inside the opening,
      a bottom plate connected to an end portion of the peripheral wall on a side closer to the refrigerant passage, and
      a fin protrusion protruding from the bottom plate toward an inside of the refrigerant passage and formed on the bottom plate, wherein
   the base has a recess formed with the peripheral wall and the bottom plate and extending toward the opening,
   the semiconductor element is disposed at the bottom plate inside the recess, and
   a thickness of the bottom plate is smaller than a thickness of the peripheral wall.

2. The semiconductor module according to claim 1, wherein a cooling surface of the bottom plate positioned on a side closer to the refrigerant passage is flush with an inner surface of the refrigerant passage.

3. The semiconductor module according to claim 1, further comprising an electrode module inserted in the recess, wherein
   the electrode module includes a body resin portion formed of resin and a terminal provided in the body resin portion and electrically connected to the semiconductor element, and
   the body resin portion is disposed between the semiconductor element and an inner surface of the peripheral wall.

4. The semiconductor module according to claim 3, wherein the body resin portion of the electrode module is in contact with an inner surface of the recess so that the electrode module is positioned relative to the base.

5. The semiconductor module according to claim 1, further comprising a filling resin filled in the recess.

6. A semiconductor module comprising:
   a refrigerant jacket including a refrigerant passage through which a refrigerant circulates and an opening extending from an outer surface to the refrigerant passage;
   a base mounted on the refrigerant jacket and closing the opening; and
   a semiconductor element provided at the base,
   the base including
      a peripheral wall in an annular shape positioned inside the opening,
      a flange disposed annularly around the peripheral wall and positioned on an upper surface of the refrigerant jacket,
      a bottom plate connected to an end portion of the peripheral wall on a side closer to the refrigerant passage, and
      a fin protrusion protruding from the bottom plate toward an inside of the refrigerant passage and formed on the bottom plate, wherein
   the base has a recess formed with the peripheral wall and the bottom plate and extending toward the opening,
   the semiconductor element is disposed at the bottom plate inside the recess, and
   a thickness of the bottom plate is smaller than a thickness of the flange.

7. The semiconductor module according to claim 6, wherein a cooling surface of the bottom plate positioned on a side closer to the refrigerant passage is flush with an inner surface of the refrigerant passage.

8. The semiconductor module according to claim 6, further comprising an electrode module inserted in the recess, wherein
   the electrode module includes a body resin portion formed of resin and a terminal provided in the body resin portion and electrically connected to the semiconductor element, and
   the body resin portion is disposed between the semiconductor element and an inner surface of the peripheral wall.

9. The semiconductor module according to claim 8, wherein the body resin portion of the electrode module is in contact with an inner surface of the recess so that the electrode module is positioned relative to the base.

10. The semiconductor module according to claim 6, further comprising a filling resin filled in the recess.

* * * * *